US012745446B2

(12) United States Patent
Tsai et al.

(10) Patent No.: US 12,745,446 B2
(45) Date of Patent: Sep. 22, 2026

(54) SEMICONDUCTOR STRUCTURE AND METHOD OF FORMING THE SAME

(71) Applicant: Winbond Electronics Corp., Taichung City (TW)

(72) Inventors: Shou-Chi Tsai, Tainan City (TW); Kai Jen, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 563 days.

(21) Appl. No.: 18/075,020

(22) Filed: Dec. 5, 2022

(65) Prior Publication Data

US 2024/0186396 A1 Jun. 6, 2024

(51) Int. Cl.
*H10D 64/66* (2025.01)
*H10D 64/01* (2025.01)

(52) U.S. Cl.
CPC ........... *H10D 64/667* (2025.01); *H10D 64/01* (2025.01)

(58) Field of Classification Search
None
See application file for complete search history.

(56) References Cited

U.S. PATENT DOCUMENTS 8,697,508 B2 4/2014 Wen et al.
2019/0164975 A1* 5/2019 Song .................... H10B 12/315
2019/0206877 A1* 7/2019 Kim ........................ H10B 63/30
2021/0035983 A1* 2/2021 Song .................... H10B 12/315
2021/0193664 A1* 6/2021 Seong .................. H10B 12/485
2022/0139836 A1* 5/2022 Son ...................... H10B 12/482 257/296
2022/0139927 A1* 5/2022 Chang .................... H10B 12/50 257/296
2022/0271041 A1* 8/2022 Bae ....................... H01L 23/528
2023/0057316 A1* 2/2023 Won ........................ H10B 12/09
2023/0063527 A1* 3/2023 Lee ...................... H10B 12/315
2023/0133763 A1* 5/2023 Lee ...................... H10B 12/315 257/296
2023/0146151 A1* 5/2023 Lee ...................... H10B 12/315 257/296
2023/0363149 A1* 11/2023 Bae ........................ H10B 12/50

* cited by examiner

*Primary Examiner* — Erik T. K. Peterson
(74) *Attorney, Agent, or Firm* — MUNCY, GEISSLER, OLDS & LOWE, P.C.

(57) ABSTRACT

A semiconductor structure and a method of forming the same are provided. The semiconductor structure includes a first work function layer, a second work function layer, a protective layer, a gate stack, a first liner, a second liner, a planarization layer, and a gate plug. The first work function layer is disposed on a substrate. The second work function layer is disposed on the first work function layer. The protective layer is disposed on the second work function layer. The gate stack is disposed on the protective layer. The first liner is disposed on the gate stack. The second liner is disposed on the first liner. The planarization layer is disposed on the second liner. The gate plug is disposed on the planarization layer and in contact with the first work function layer and the second work function layer.

19 Claims, 8 Drawing Sheets

500
500A
500B
500C
590
580
620
300
200
130
120
100
WL
500A
720
500B
P12
610
710
630
500C
640
400
113
111
112

650
P11

SEMICONDUCTOR STRUCTURE AND METHOD OF FORMING THE SAME

BACKGROUND OF THE INVENTION

Field of the Invention

The present disclosure relates to a semiconductor structure and a method of forming the same, and, in particular, to a semiconductor structure that includes a gate plug in contact with a dual work function word line and a method of forming the same.

Description of the Related Art

With the trend of miniaturization of semiconductor devices, the size of dynamic random access memory (DRAM) also continues to shrink to increase integration and improve performance. However, the decreased size causes problems such as gate-induced drain leakage (GIDL) between adjacent components, which can adversely affect the performance of the memory.

BRIEF SUMMARY OF THE INVENTION

In view of the above problems, the present disclosure reduces the etching damage of other components during the etching process in forming a semiconductor structure by providing a first liner and a second liner for use as etch stop layers for different components. Therefore, the electrical properties, reliability and/or process window of the semiconductor structure are improved.

An embodiment of the present disclosure provides a semiconductor structure. The semiconductor structure includes a first work function layer, a second work function layer, a protective layer, a gate stack, a first liner, a second liner, a planarization layer, and a gate plug. The first work function layer is disposed on a substrate. The second work function layer is disposed on the first work function layer. The protective layer is disposed on the second work function layer. The gate stack is disposed on the protective layer. The first liner is disposed on the gate stack. The second liner is disposed on the first liner. The planarization layer is disposed on the second liner. The gate plug is disposed on the planarization layer and in contact with the first work function layer and the second work function layer.

An embodiment of the present disclosure provides a method of forming a semiconductor structure. The method includes forming a first work function layer on a substrate. A second work function layer is formed on the first work function layer. A protective layer is formed on the second work function layer. A gate stack is formed on the protective layer. A first liner is formed on the gate stack. A second liner is formed on the first liner. A planarization layer is formed on the second liner. An etching process is performed to remove the second work function layer and expose the first work function layer. A gate plug is formed, so that the gate plug is in contact with the first work function layer and the second work function layer.

DETAILED DESCRIPTION OF THE INVENTION

Herein, the schematic cross-sectional views have shown in FIGS. 1 to 15 show cross-sectional views taken along a direction parallel to an extending direction of the word line WL.

Figures 1, 2:
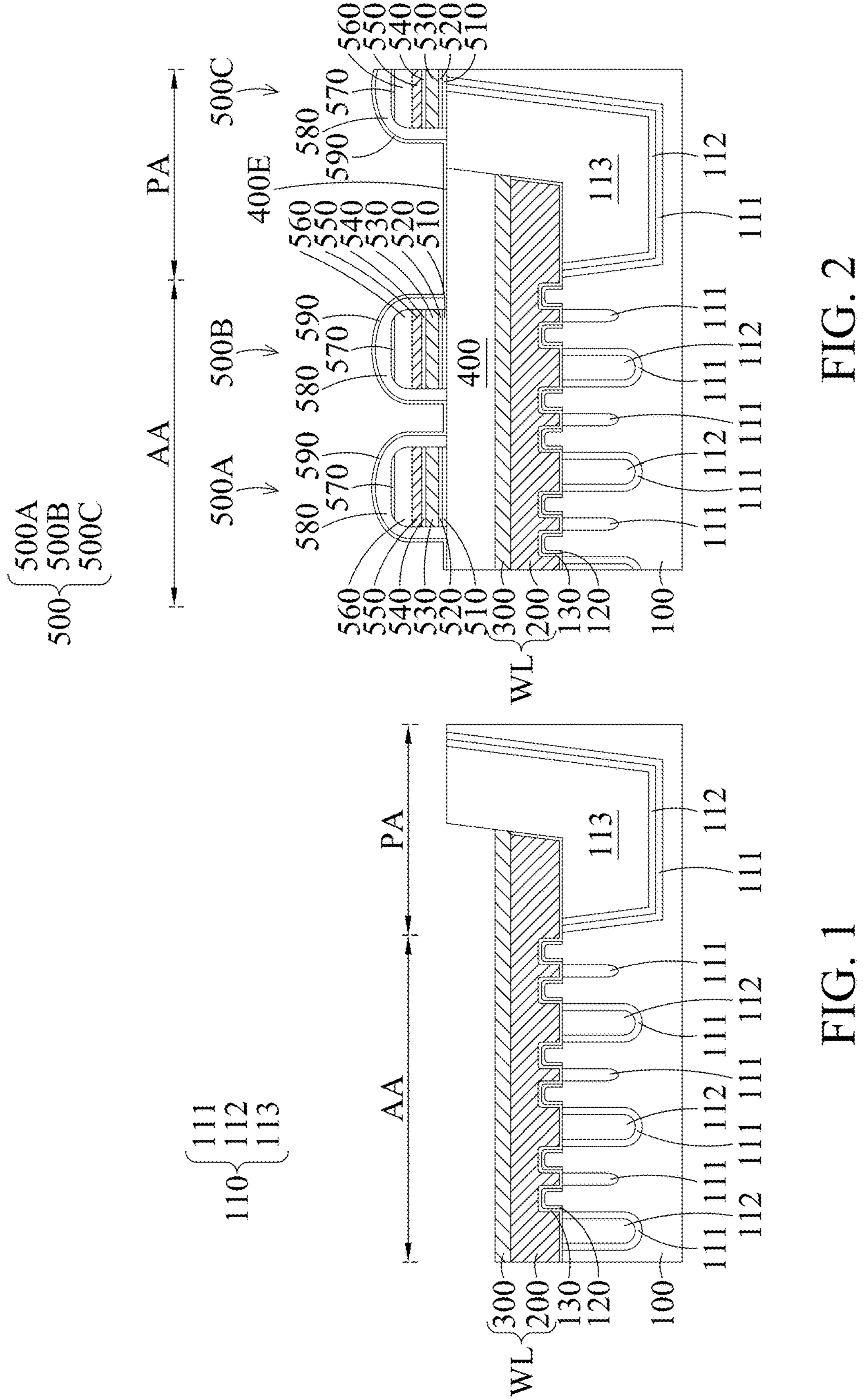
FIGS. 1-15 are schematic cross-sectional views of a semiconductor structure at various stages of formation, according to some embodiments of the present disclosure.

Referring to FIG. 1, which is a schematic cross-sectional view of a semiconductor structure according to some embodiments of the present disclosure. In some embodiments, substrate 100 may be provided. The substrate 100 may be a silicon wafer, a bulk semiconductor, or a semiconductor-on-insulation (SOI) substrate. Other types of substrates 100 are, for example, multilayer substrates or gradient substrates. The substrate 100 may include an active area AA and a peripheral area PA adjacent to the active area AA.

Isolation structure 110 may be formed in the substrate 100 to provide electrical isolation. The isolation structure 110 may include a first isolation material 111, a second isolation material 112, and/or a third isolation material 113. For example, a plurality of trenches (not shown) may be formed in the active area AA and the peripheral area PA of the substrate 100. The depth and/or shape of the plurality of trenches may be adjusted according to the pitch and the required electrical properties. Next, the first isolation material 111 may be conformally formed in the plurality of trenches in the active area AA and the peripheral area PA, and then the second isolation material 112 may be formed on the first isolation material 111. Next, in some embodiments, the third isolation material 113 may be formed in the trenches in the peripheral area PA and on the second isolation material 112. In some embodiments, an etching process may be further performed to expose the side surface of the third isolation material 113.

In some embodiments, the first isolation material 111, the second isolation material 112, and/or the third isolation material 113 may be formed by a deposition process such as a chemical vapor deposition (CVD) process. In some embodiments, the first isolation material 111, the second isolation material 112, and/or the third isolation material 113 may include or may be oxides such as silicon oxide (SiOx), nitrides such as silicon nitride (SiN), oxynitrides such as silicon oxynitride (SiON), other suitable dielectric materials, the like, or a combination thereof, but the present disclosure is not limited thereto. For example, the first isolation material 111 may be silicon oxide, the second isolation material 112 may be silicon nitride, and the third isolation material 113 may be spin on glass (SOG) oxide.

As shown in FIG. 1, a gate dielectric layer 120 may be formed on the substrate 100. In some embodiments, the gate dielectric layer 120 may be formed by a deposition process such as a chemical vapor deposition process. In some embodiments, the gate dielectric layer 120 may include or may be an oxide such as silicon oxide, a nitride such as silicon nitride, an oxynitride such as silicon oxynitride, a high dielectric constant (high-k) dielectric material, other suitable dielectric materials, the like, or a combinations thereof, but the present disclosure is not limited thereto. In some embodiments, the gate dielectric layer 120 may serve as a dielectric layer for subsequently formed word lines (for example, a word line WL). Since FIG. 1 shows a cross-sectional view taken along the extending direction of the word line WL, the gate dielectric layer 120 is discontinuous.

In some embodiments, the word line WL may be formed on the gate dielectric layer 120. In some embodiments, the top surface of the word line WL may be lower than the top surface of the third isolation material 113, and thus the word line WL may be a buried word line. In some embodiments, the word line WL may include materials with different work functions, so the subsequently formed semiconductor structures may function as dual work function memories. For example, the word line WL may include a first work function layer 200 and a second work function layer 300, the first work function layer 200 is disposed on the gate dielectric layer 120, and the second work function layer 300 is disposed on the first work function layer 200. In some embodiments, the second work function layer 300 may be in contact with the third isolation material 113. In some embodiments, the second work function layer 300 may extend continuously on the top surface of the first work function layer 200. Specifically, the second work function layer 300 located on the third isolation material 113 may be continuously disposed. That is, the second work function layer 300 at the interface adjacent to the active area AA and the peripheral area PA may be continuous.

In some embodiments, the word line WL may be formed by a chemical vapor deposition process or a physical vapor deposition (PVD) process. The word line WL may include or may be polycrystalline silicon, amorphous silicon, metals such as tungsten (W), copper (Cu), silver (Ag), gold (Au), cobalt (Co), metal nitrides such as tungsten nitride (WN), titanium nitride (TiN), conductive metal oxides, other suitable materials, the like, or a combination thereof, but the present disclosure is not limited thereto. In some embodiments, the first work function layer 200 may be tungsten, and the second work function layer 300 may be polycrystalline silicon, so the word line WL may be a dual work function word line including tungsten and polycrystalline silicon.

As shown in FIG. 1, a buffer layer 130 may be further formed between the gate dielectric layer 120 and the word line WL, thereby improving the compatibility between the gate dielectric layer 120 and the word line WL. Thus, the reliability of the semiconductor structure is improved. In some embodiments, the buffer layer 130 may be formed by a chemical vapor deposition process or a physical vapor deposition process, and the buffer layer 130 may be titanium nitride (TiN). In other embodiments, the buffer layer 130 may be omitted.

Referring to FIG. 2, a protective layer 400 may be formed on the second work function layer 300 to protect components located under the protective layer 400, such as the second work function layer 300 and the first work function layer 200. In some embodiments, the protective layer 400 covers the top surface of the second work function layer 300 and is in contact with the third isolation material 113. In some embodiments, the top surface of the protective layer 400 may be aligned with the top surface of the third isolation material 113. Therefore, once the protective layer 400 is formed, it may be considered that the buried word line of the present disclosure is completed.

The protective layer 400 may be formed by a chemical vapor deposition process, and the protective layer 400 may include or may be an oxide such as silicon oxide, a nitride such as silicon nitride, an oxynitride such as silicon oxynitride, or other suitable dielectric materials, the like, or a combination thereof, but the present disclosure is not limited thereto. In some embodiments, the protective layer 400 may be silicon nitride. In some embodiments, after the protective layer 400 is formed, the protective layer 400 and components under the protective layer 400 may serve as primary circuits, and the components above the protective layer 400 may serve as secondary or higher level circuits.

Next, a gate stack 500 may be formed on the protective layer 400. The gate stack 500 may include a first gate stack 500A and a second gate stack 500B disposed in the active area AA and a third gate stack 500C disposed in the peripheral area PA. In some embodiments, the gate stack 500 may be used as a peripheral circuit gate of the secondary circuit to transmit signals to the word line WL. In some embodiments, a subsequently formed peripheral circuit conductive plug (for example, the gate plug 810 shown in FIG. 15) may be disposed between the second gate stack 500B and the third gate stack 500C. Therefore, the peripheral circuit conductive plug may be electrically connected to an end of the word line WL.

The gate stack 500 may further include a gate structure, a first spacer layer 580, and a second spacer layer 590. The gate structures may be disposed on the protective layer 400 spaced apart from each other. The gate structure may further include a dielectric layer 510, a dielectric layer 520, a conductive layer 530, a buffer layer 540, a conductive layer 550, a dielectric layer 560, and a dielectric layer 570 sequentially disposed on the protective layer 400.

In some embodiments, the buffer layer 540 may be omitted. In some embodiments, the dielectric layer 510 may be a SOG oxide, the dielectric layer 520 may be a silicon nitride, the conductive layer 530 may be a polycrystalline silicon, the buffer layer 540 may be titanium nitride, the conductive layer 550 may be tungsten, and the dielectric layer 560 and the dielectric layer 570 may be silicon nitride. Next, the conformally formed dielectric layer 510, dielectric layer 520, conductive layer 530, buffer layer 540, conductive layer 550, dielectric layer 560, and dielectric layer 570 may be patterned to form a plurality of gate structures separated from each other.

As shown in FIG. 2, a first spacer layer 580 and a second spacer layer 590 may be formed on the gate structure. In some embodiments, the first spacer layer 580 may be conformally formed on the dielectric layer 510, the dielectric layer 520, the conductive layer 530, the buffer layer 540, the conductive layer 550, the dielectric layer 560, and the dielectric layer 570. Next, an etching process is performed on the first spacer layer 580 to expose a portion 400E of the top surface of the protective layer 400. Wherein, the first spacer layer 580 may be disposed on the top surface and the side surface of the gate structure. Then, a second spacer layer 590 may be conformally formed on the first spacer layer 580, and the second spacer layer 590 covers the exposed portion 400E of the top surface of the protective layer 400. In some embodiments, the first spacer layer 580, the second spacer layer 590, and the protective layer 400 are in contact with each other. In some embodiments, the materials and formation methods of the first spacer layer 580 and the second spacer layer 590 may be the same or different from those of the buffer layer 130. In some embodiments, the first spacer layer 580 and the second spacer 590 have different etching selectivity ratios. In some embodiments, the first spacer layer 580 may be silicon oxide, and the second spacer layer 590 may be silicon nitride.

Figures 3, 4:
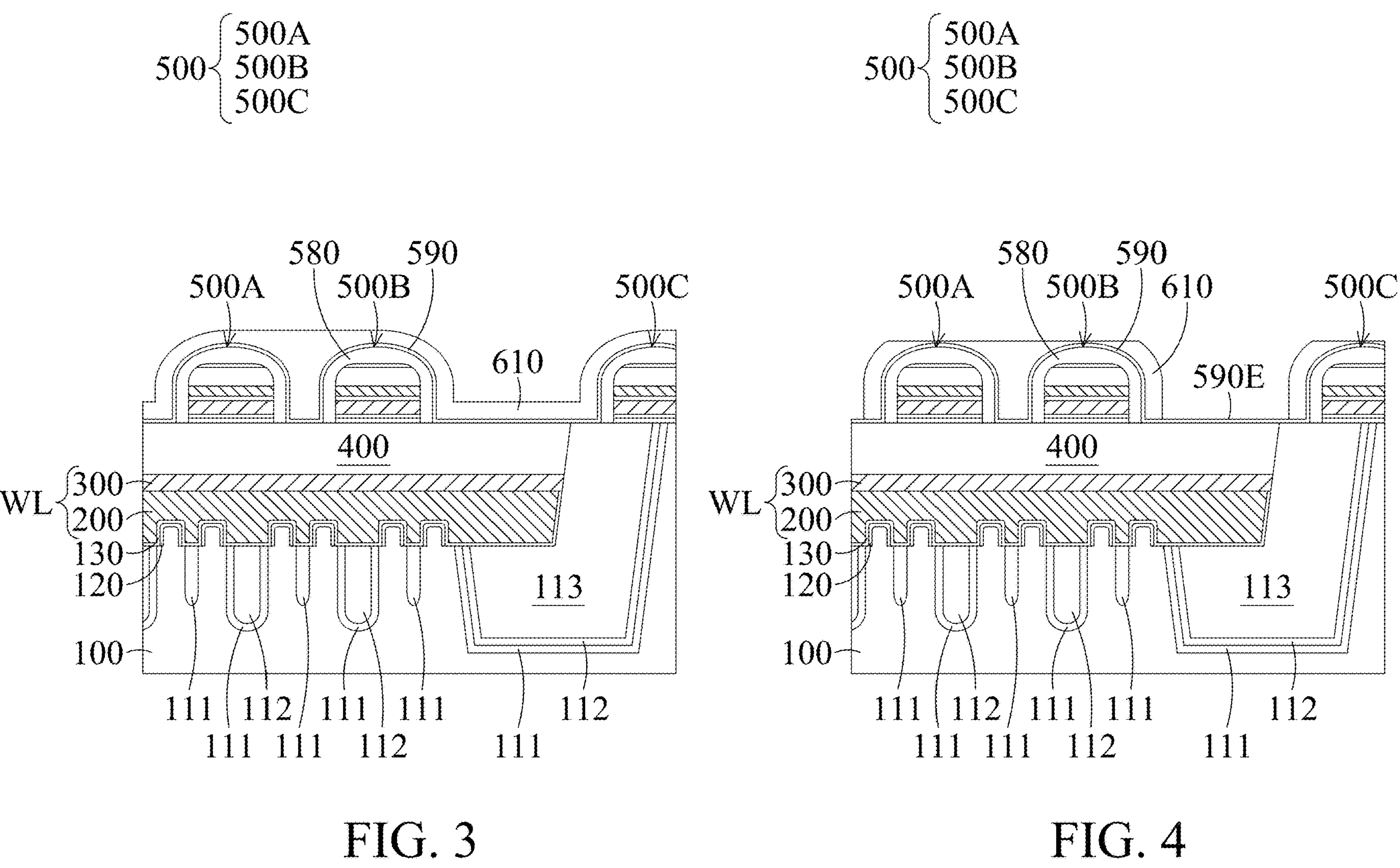

Referring to FIG. 3, a first liner 610 may be formed on the gate stack 500. For example, the first liner 610 may be conformally formed on the second spacer layer 590. In some embodiments, the material and formation method of the first liner 610 may be the same or different from those of the first spacer layer 580 and/or the second spacer layer 590. In some embodiments, the first liner 610 may include silicon oxide. In some embodiments, the space between the first gate stack 500A and the second gate stack 500B is smaller than the space between the second gate stack 500B and the third gate stack 500C, so the first liner 610 may be filled between the first gate stack 500A and the second gate stack 500B. Accordingly, the first liner 610 may cover the second spacer layer 590 between the first gate stack 500A and the second gate stack 500B. In some embodiments, the top surface of the first liner 610 between the first gate stack 500A and the second gate stack 500B is higher than the top surface of the first liner 610 between the second gate stack 500B and the third gate stack 500C.

Referring to FIG. 4, a portion of the first liner 610 may be removed by an etching process using the second spacer layer 590 as an etch stop layer, to expose an exposed portion 590E of the gate stack 500. The first liner 610 exposes the top surface of the second spacer layer 590 between the second gate stack 500B and the third gate stack 500C. For example, the etching process may include dry etching, wet etching, or other suitable etching methods. The dry etching may include a plasma etching, a plasma free gas etching, a sputter etching, an ion milling, or a reactive ion etching (RIE), but the present disclosure is not limited thereto. The wet etching may include the use of acidic solutions, alkaline solutions, or solvents to remove the structures to be removed, but the present disclosure is not limited thereto. In some embodiments, the first liner 610 is removed by the dry etching process.

Figures 5, 6:
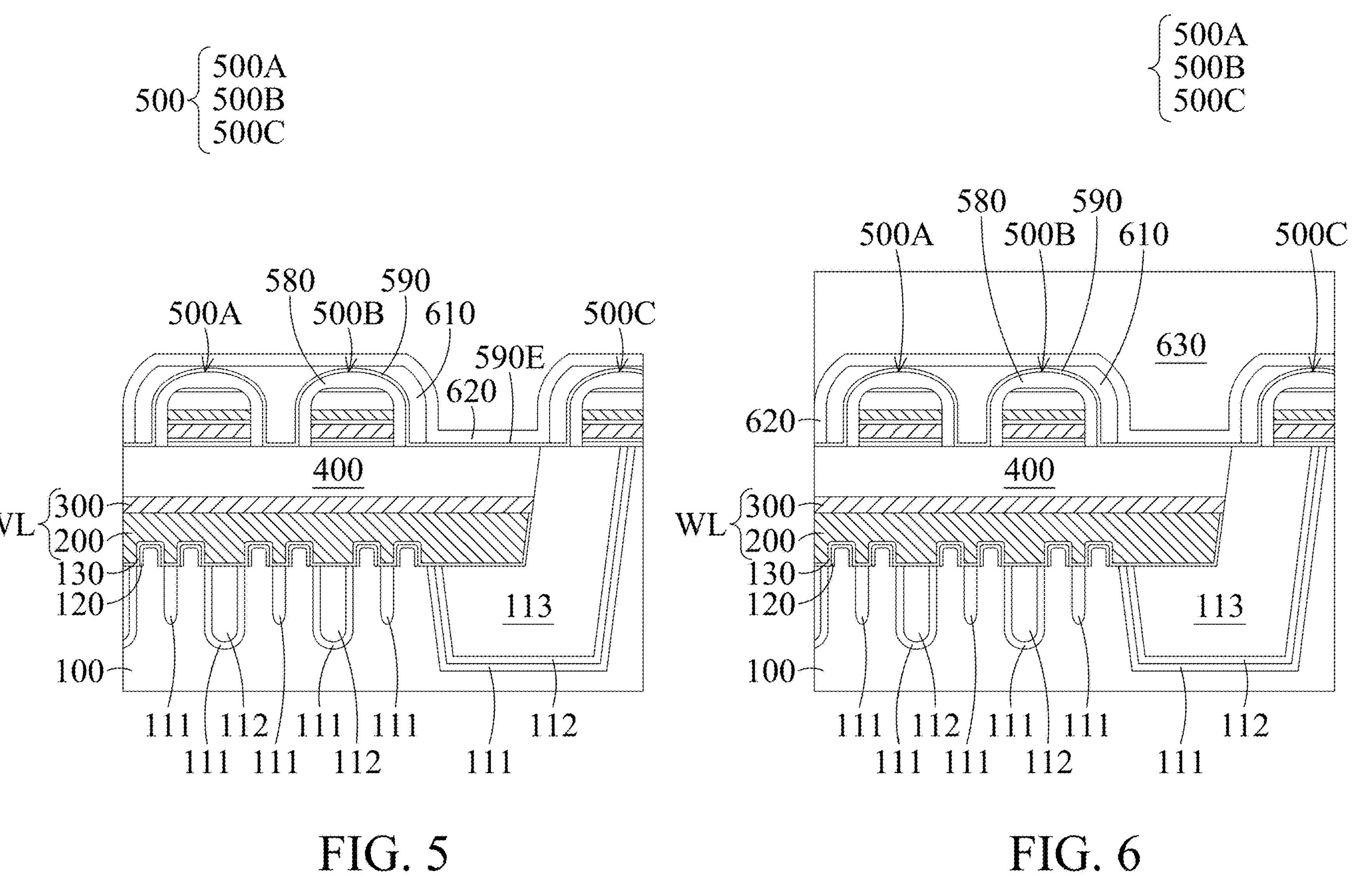

Referring to FIG. 5, a second liner 620 may be formed on the first liner 610 and covers the exposed portion 590E of the gate stack 500. For example, the second liner 620 is conformally formed on the first liner 610 and the exposed portions 590E of the second spacer layer 590. Thus, in some embodiments, the first liner 610, the second liner 620, and the second spacer layer 590 are in contact with each other. The material and formation method of the second liner 620 may be the same as or different from those of the first liner 610. In some embodiments, the second liner 620 may include silicon nitride. Similarly, in some embodiments, the top surface of the second liner 620 between the first gate stack 500A and the second gate stack 500B is higher than the top surface of the second liner 620 between the second gate stack 500B and the third gate stack 500C.

Referring to FIG. 6, a planarization layer 630 may be blanketly formed on the second liner 620. The material and formation method of the planarization layer 630 may be the same or different from those of the first liner 610 and/or the second liner 620. In some embodiments, the planarization layer 630 may be SOG oxide.

Figures 7, 8:
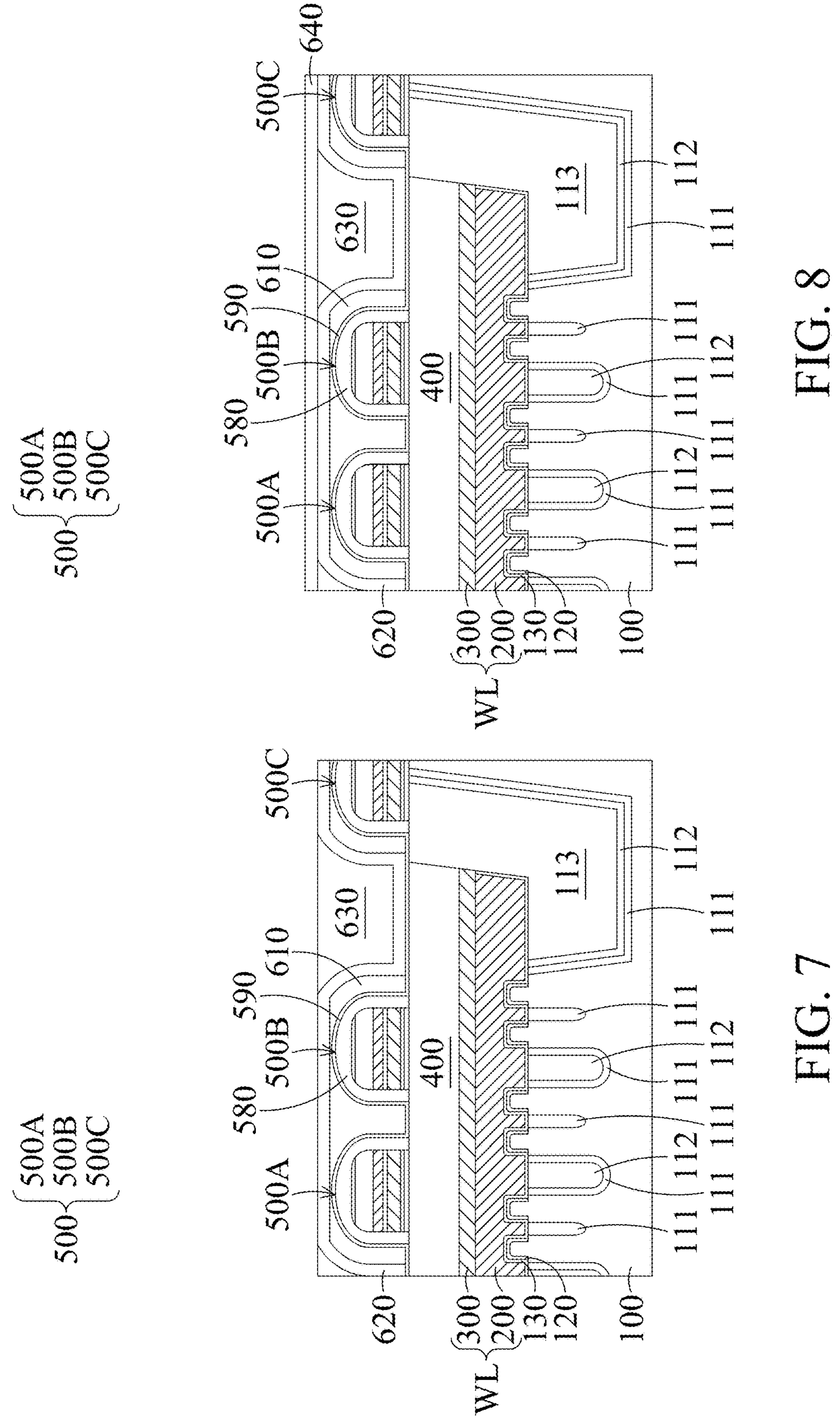

Referring to FIG. 7, a chemical mechanical polishing (CMP) process may be performed on the planarization layer 630 by using the second liner 620 as an etch stop layer, so that the top surface of the second liner 620 is aligned with the top surface of the planarization layer 630. For example, when a signal of silicon nitride of the second liner 620 is detected during the CMP process, the CMP process is stopped.

Referring to FIG. 8, in some embodiments, a capping layer 640 may be formed on the planarization layer 630. The material and formation method of the capping layer 640 may be the same or different from those of the planarization layer 630. In some embodiments, the capping layer 640 may be a nitride. For example, the capping layer 640 may serve as a barrier layer or an etch stop layer for the word line WL.

Figures 9, 10:
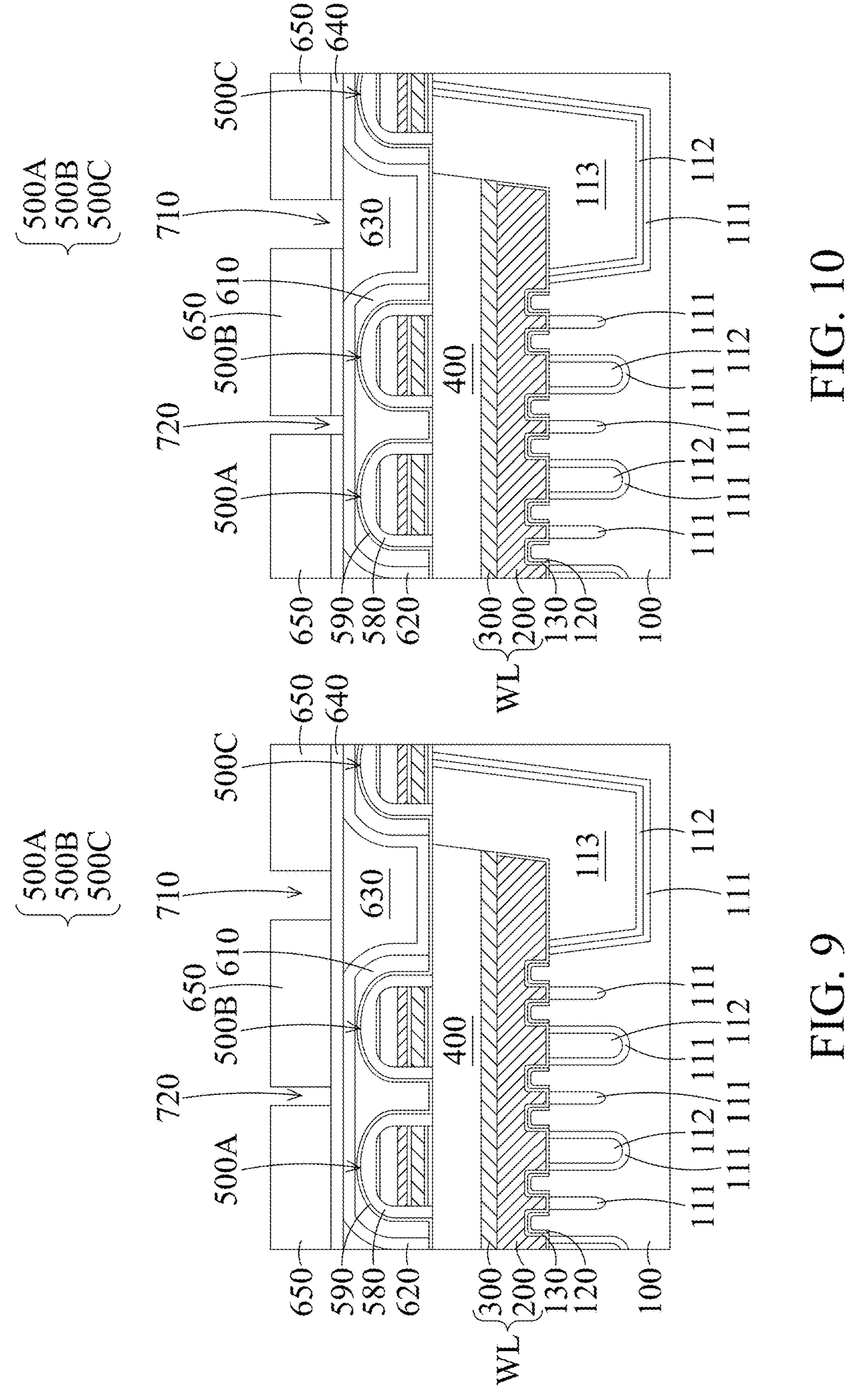

Referring to FIG. 9, a patterned photoresist layer 650 may be formed on the capping layer 640 to expose a portion of the capping layer 640. For example, the material of the photoresist layer is blanketly formed on the capping layer 640, a mask (not shown) is formed on the material of the photoresist layer, and the material of the photoresist layer is patterned. The mask is then removed to form the patterned photoresist layer 650. The pattern of the patterned photoresist layer 650 may correspond to the pattern of a subsequently formed conductive layer (for example, the conductive layer 800). For example, the first opening 710 of the patterned photoresist layer 650 may correspond to the subsequently formed gate plug 810, and the second opening 720 of the patterned photoresist layer 650 may correspond to the subsequently formed conductive line 820.

Referring to FIG. 10, a portion of the capping layer 640 is removed, so that the first opening 710 and the second opening 720 extend toward the substrate 100, thereby exposing the top surfaces of the planarization layer 630 and the second liner 620. In some embodiments, in order to remove the capping layer 640 and leave the second liner 620, a dry etching process is performed and the etched thickness caused by the dry etching process is controlled.

Figures 11, 12:
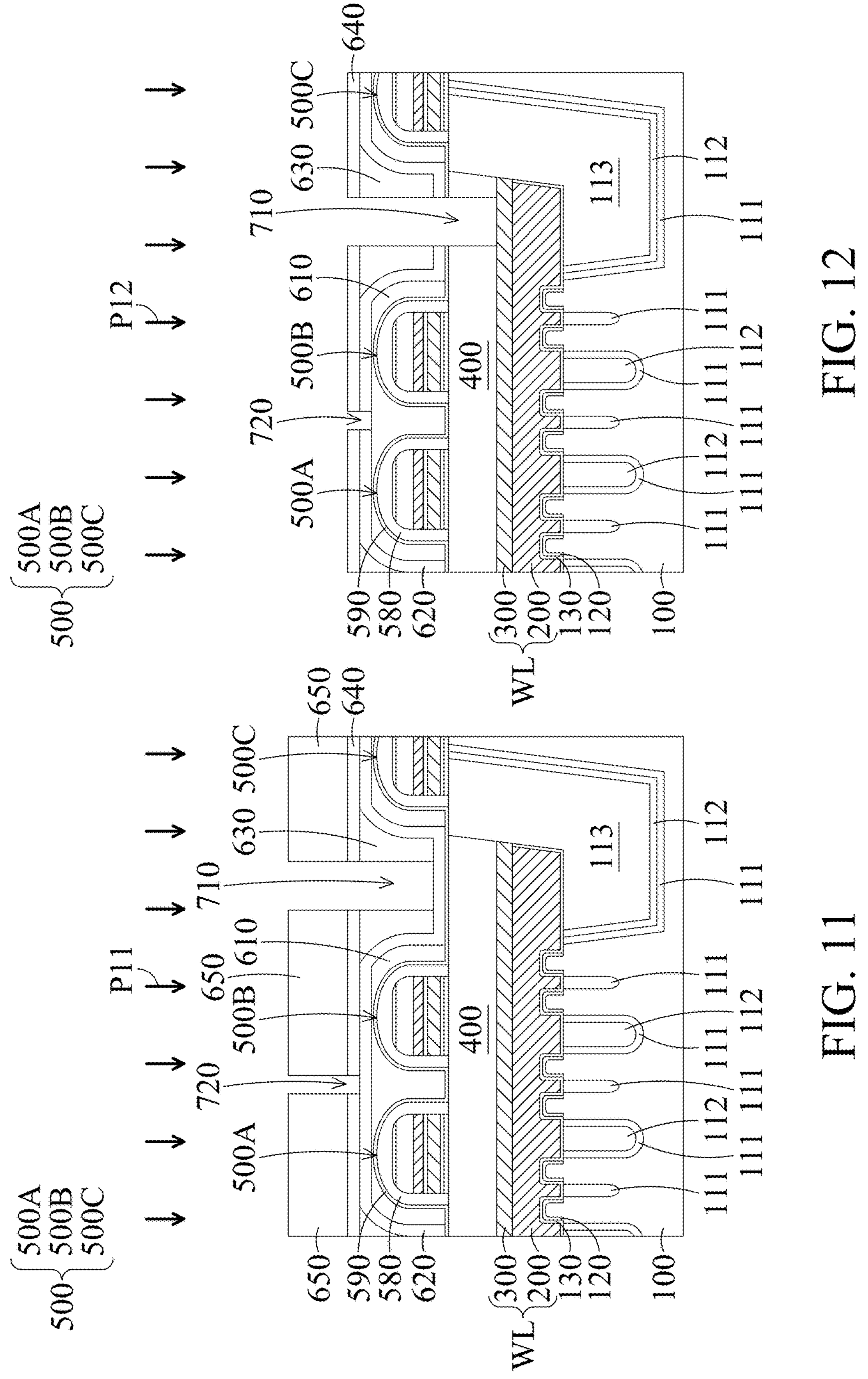

Referring to FIG. 11, a first etching process P11 is performed by using the second liner 620 as an etch stop layer to remove a portion of the planarization layer 630. Therefore, the first opening 710 may be extended toward the substrate 100, and the first opening 710 may expose the second liner 620. In some embodiments, the planarization layer 630 and the second liner 620 may have different etching selectivity ratios (etching rates). In some embodiments, the planarization layer 630 may include silicon oxide and the second liner 620 may include silicon nitride. The second liner 620 may be substantially remained while the planarization layer 630 may be removed through the etching selectivity ratio between silicon oxide and silicon nitride, such as 5:1~10:1.

Referring to FIG. 12, a second etching process P12 is performed by using the first liner 610 and the second work function layer 300 of the word line WL as an etch stop layer, to remove the second liner 620, the second spacer layer 590 of the gate stack 500, and the protective layer 400. Therefore, the first opening 710 and the second opening 720 may be extended toward the substrate 100. Thus, the first opening 710 may expose the second work function layer 300, and the second opening 720 may expose the first liner 610. In some embodiments, the first liner 610 and the second liner 620 may have different etching selectivity ratios (etching rates). In some embodiments, the first liner 610 and the second spacer layer 590 may have different etching selectivity ratios (etching rates). In some embodiments, the first liner 610 and the protective layer 400 may have different etching selectivity ratios (etching rates). In some embodiments, the first liner 610 may include silicon oxide, and the second liner 620, the second spacer layer 590, and the protective layer 400 may include silicon nitride. The first liner 610 may be substantially remained while the second liner 620, the second spacer layer 590, and the protective layer 400 may be removed through the etching selectivity ratio between silicon oxide and silicon nitride, such as 1:5~1:10.

In some embodiments, the second etching process P12 may simultaneously remove the patterned photoresist layer 650. In other embodiments, the patterned photoresist layer 650 may be removed by performing further processes such as an ashing process.

Figures 13, 14:
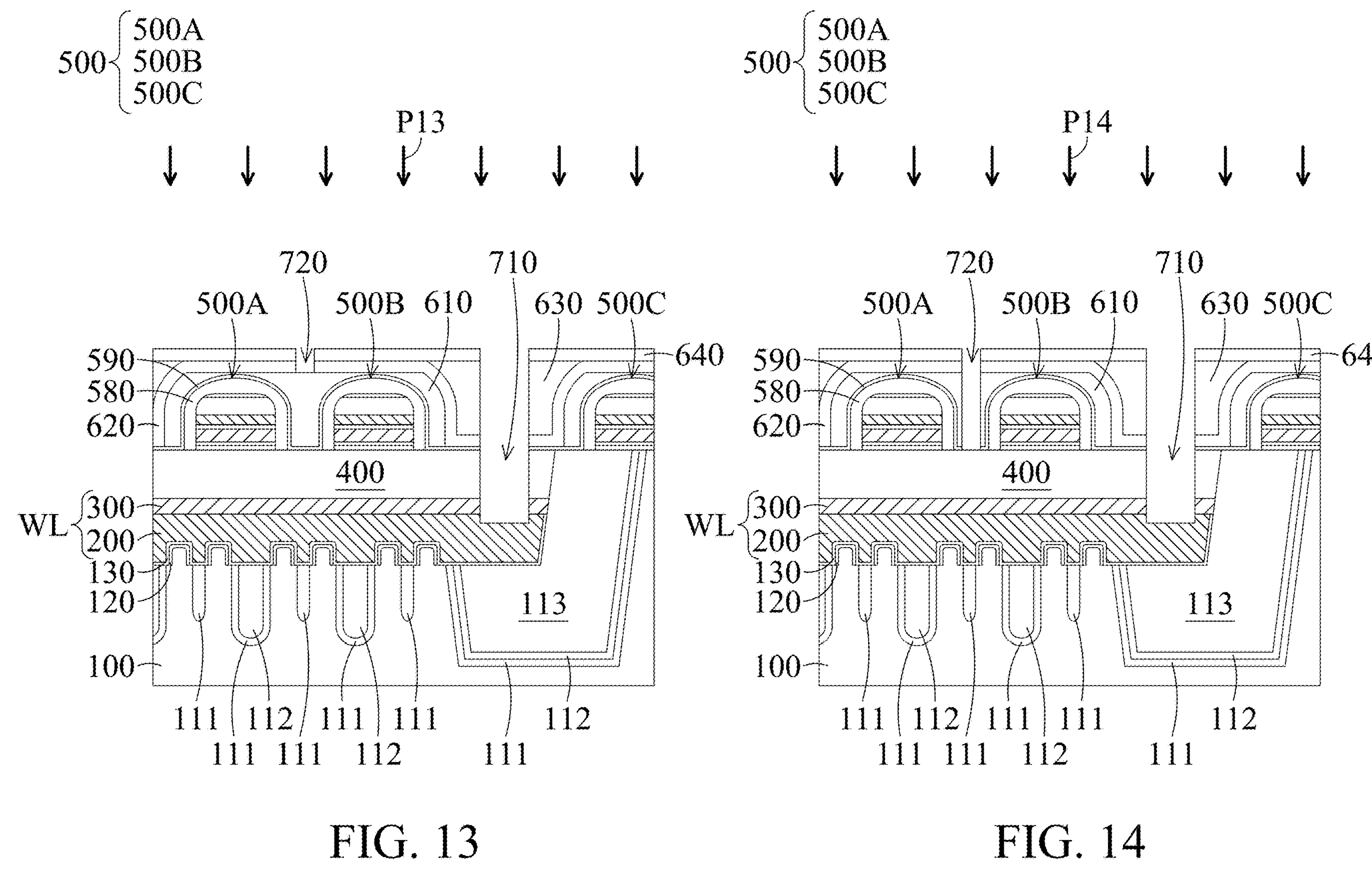

Referring to FIG. 13, in some embodiments, a third etching process P13 is performed by using the first liner 610 as an etch stop layer, to remove the second work function layer 300. Therefore, the first opening 710 may be extended toward the substrate 100, and the first opening 710 may expose the first work function layer 200. In some embodiments, the first liner 610 and the second work function layer 300 may have different etching selectivity ratios (etching rates). In some embodiments, the first liner 610 may include silicon oxide, and the second work function layer 300 may include polycrystalline silicon. The first liner 610 may be substantially remained while the second work function layer 300 may be removed through the etching selectivity ratio between silicon oxide and polycrystalline silicon, such as 1:5~1:10.

In some embodiments, the third etching process P13 may be performed by using the first liner 610 as a mask, to remove the second work function layer 300. In some embodiments, the first opening 710 may have a substantially vertical side surface. Therefore, the second work function layer 300 may also have a substantially vertical side surface. Accordingly, the concentration of the electric field may be avoided, thereby improving the uniformity of the electric field distribution of the word line WL. In some embodiments, the side surface of the second work function layer 300 is substantially aligned with the side surface of the protective layer 400.

In some embodiments, a portion of the first work function layer 200 may be further removed during the removal of the second work function layer 300. Thus, the contact area of the subsequently formed conductive plugs (for example, the gate plugs 810) and the word line WL is increased to improve the process window and the reliability of the subsequently formed conductive plugs. In some embodiments, the side surface of the second work function layer 300 and the side surface of the first work function layer 200 may be vertical side surfaces and may be substantially aligned with each other.

In some embodiments, after the formation of the planarization layer 630, etching processes such as the first etching process P11, the second etching process P12, and the third etching process P13 may be performed. In other words, during the process for forming the first opening 710 and the second opening 720, the second work function layer 300 may be removed simultaneously. Therefore, the process of patterning the second work function layer 300 with an additional mask before the formation of the planarization layer 630 may be omitted. Thus, the number of processes and the number of masks are reduced thereby reducing the process cost. Furthermore, the third etching process P13 is performed after the formation of the planarization layer 630, so that the side surface of the second work function layer 300 may be a vertical side surface.

In some embodiments, a peripheral gate contact (not shown) may be disposed between the first gate stack 500A and the second gate stack 500B, and the peripheral gate contact may be electrically connected to a subsequently formed wire (for example, the wire 820). In some embodiments, the peripheral gate contact may include silicon. However, since the etching selectivity ratios (etching rates) of silicon and polycrystalline silicon are difficult to distinguish, the peripheral gate contact may be damaged by the third etching process P13 for the polycrystalline silicon. However, in the present disclosure, since the first liner 610 is disposed between the first gate stack 500A and the second gate stack 500B, the first liner 610 may substantially cover the peripheral gate contact, and the first liner 610 may protect the peripheral gate contact from damaged by the third etching process P13, thereby improving the reliability of the semiconductor structure.

As shown in FIG. 13, in some embodiments, the planarization layer 630, the second liner 620, and the first liner 610, which are referred as oxide-nitride-oxide (ONO) structure, may be disposed on the gate stack 500. In some embodiments, the planarization layer 630, the second liner 620, the first liner 610, the second spacer layer 590, and the first spacer layer 580, which are referred as oxide-nitride-oxide-nitride-oxide (ONONO) structure, may be disposed on the gate structure. Therefore, the reliability of the semiconductor structure is improved by using the above-mentioned ONO structure or the ONONO structure as an etch stop layer for each component.

Referring to FIG. 14, a fourth etching process P14 is performed to remove the first liner 610 and the second spacer layer 590. Therefore, the second opening 720 may be extended toward the substrate 100, and the second opening 720 may expose the protective layer 400. In some embodiments, the fourth etching process P14 may include removing the first liner 610 by using the second spacer layer 590 as an etch stop layer: and removing the second spacer layer 590 and remaining the protective layer 400 by using a dry etching process and controlling the etched thickness of the dry etching process. In some embodiments, the peripheral gate contact may be exposed by performing the fourth etching process P14.

Figure 15:
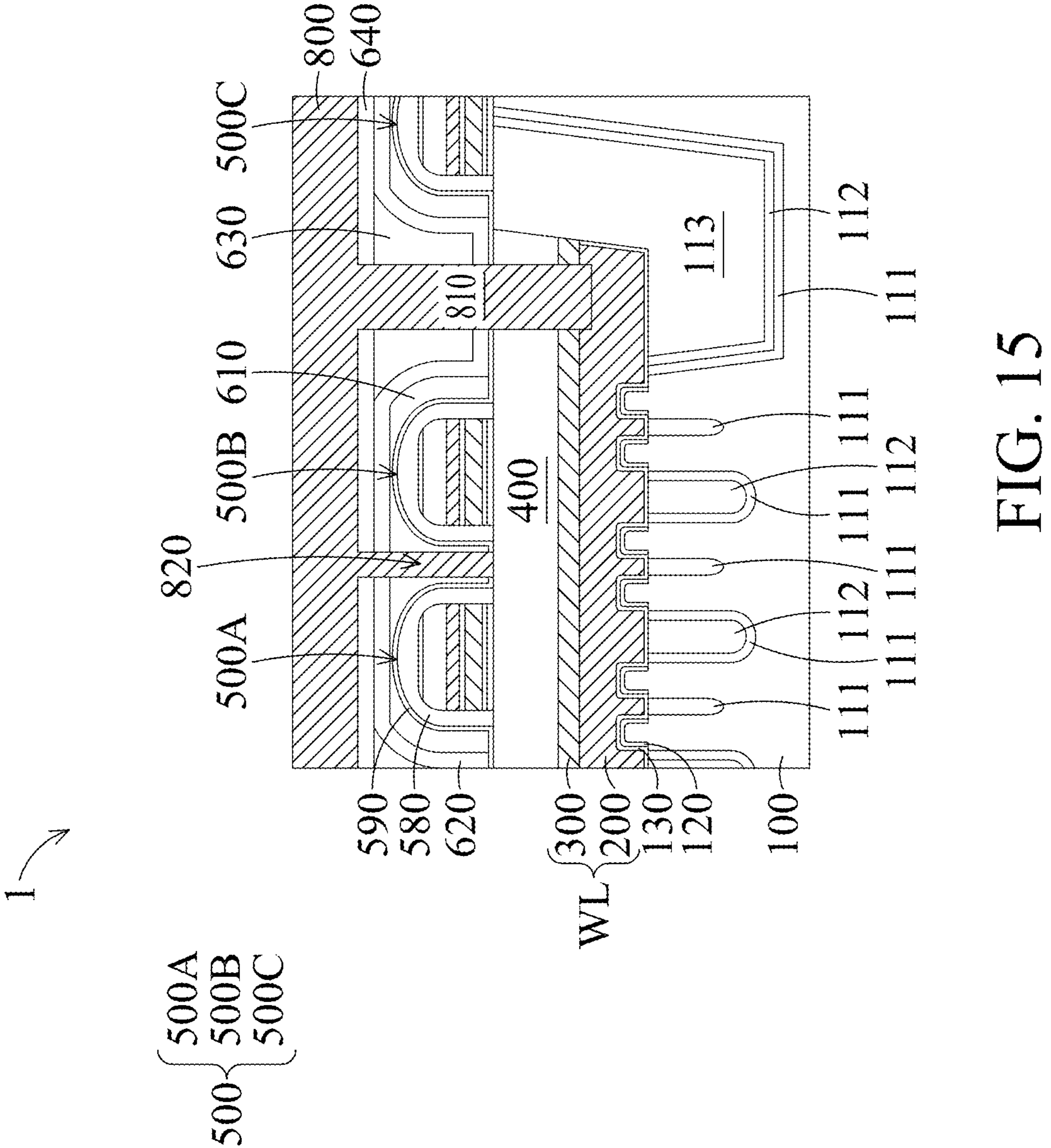

Referring to FIG. 15, the gate plug 810 may be formed on the planarization layer 630, and the gate plug 810 may be in contact with the second work function layer 300 and the first work function layer 200, so as to obtain the semiconductor structure 1. In some embodiments, a conductive layer 800 may be blanketly formed on the capping layer 640 and in the first opening 710 and second opening 720, to form the gate plug 810 in the first opening 710 and the wire 820 in the second opening 720. In some embodiments, the conductive layer 800 may include the gate plug 810 and the wire 820. In some embodiments, the material and formation method of the conductive layer 800 may be the same or different from those of the word line WL. In some embodiments, the conductive layer 800 may be tungsten.

In some embodiments, the gate plug 810 may be in contact with one end of the word line WL. In other words, the gate plug 810 may extend through the capping layer 640, the planarization layer 630, the second liner 620, the second spacer layer 590, the protective layer 400, and the second work function layer 300, in order to be in contact with the second work function layer 300 and the first work function layer 200. Therefore, in the case where the gate plug 810 is in contact with both of the second work function layer 300 and the first work function layer 200, the gate plug 810 may control the second work function layer 300 and the first work function layer 200 at the same time, thereby improving the controllability of the semiconductor structure 1.

In some embodiments, the wire 820 may be electrically connected to the peripheral gate contact between the first gate stack 500A and the second gate stack 500B, to control the first gate stack 500A and/or the second gate stack 500B.

In some embodiments, the semiconductor structure 1 may function as a memory structure. In some embodiments, further processes, such as deposition processes, etching processes, and the like, may be performed on the semiconductor structure 1 to form the memory structure.

In summary, the semiconductor structure of the present disclosure includes the gate plug contacting the first work function layer and the second work function layer, so the gate plug may control the first work function layer and the second work function layer at the same time, thereby, the contact area of the gate plug with the word line may be increased, so as to improve the controllability of the semiconductor structure. The semiconductor structure of the present disclosure includes the first liner and the second liner as etch stop layers, to reduce damage to other components during the etching process. Therefore, the leakage current between the components may be reduced, and the service life of the semiconductor structure may be improved, thereby increasing the reliability of the semiconductor structure.

Furthermore, the method for forming the semiconductor structure of the present disclosure protects the peripheral circuit contacts from being damaged by the etching process by disposing the first liner, the second liner, and the planarization layer with different etching selectivity ratios (etching rates) in a specific order. Thus, the reliability of the semiconductor structure is maintained when the number of masks is reduced. In addition, the method for forming the semiconductor structure of the present disclosure provides the first work function layer and the second work function layer with aligned side surfaces, so as to improve the uniformity of the electric field distribution of the semiconductor structure.

The foregoing outlines features of several embodiments so that those skilled in the art may better understand the aspects of the present disclosure. Those skilled in the art should appreciate that they may readily use the present disclosure as a basis for changing, replacing, substituting, or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, replaces, substitutes and modifies, and alterations herein without departing from the spirit and scope of the present disclosure.

What is claimed is:

1. A semiconductor structure, comprising:
- a first work function layer disposed on a substrate;
- a second work function layer disposed on the first work function layer;
- a protective layer disposed on the second work function layer;
- a gate stack disposed on the protective layer;
- a first liner disposed on a top surface and side surfaces of the gate stack;
- a second liner disposed on a top surface and side surfaces of the first liner;
- a planarization layer disposed on the second liner;
- a gate plug disposed on the planarization layer and in contact with the first work function layer and the second work function layer; and
- a wire disposed on the protective layer, wherein the wire is in electrical contact with the gate plug and extends through both the first liner and the second liner.

2. The semiconductor structure as claimed in claim 1, wherein a side surface of the first work function layer is aligned with a side surface of the second work function layer.

3. The semiconductor structure as claimed in claim 1, wherein the gate plug extends through the planarization layer, the second liner, the protective layer, and the second work function layer.

4. The semiconductor structure as claimed in claim 1, wherein the first liner comprises an oxide and the second liner comprises a nitride.

5. The semiconductor structure as claimed in claim 1, wherein the planarization layer comprises an oxide and the second liner layer comprises a nitride.

6. The semiconductor structure as claimed in claim 1, wherein the first liner comprises an oxide and the protective layer comprises a nitride.

7. The semiconductor structure as claimed in claim 1, wherein the first liner comprises an oxide and the second work function layer comprises polycrystalline silicon.

8. The semiconductor structure as claimed in claim 1, wherein a top surface of the planarization layer is aligned with a top surface of the second liner.

9. The semiconductor structure as claimed in claim 1, wherein the second work function layer has a vertical side surface.

10. The semiconductor structure as claimed in claim 1, wherein a side surface of the second work function layer is aligned with a side surface of the protective layer.

11. The semiconductor structure as claimed in claim 1, wherein the first work function layer has a vertical side surface.

12. The semiconductor structure as claimed in claim 1, wherein the gate stack further comprises:
- a gate structure disposed on the protective layer; and
- a spacer layer disposed on the gate structure,
- wherein the first liner and the second liner contact the spacer layer.

13. The semiconductor structure as claimed in claim 12, wherein the spacer layer further comprises:
- a first spacer layer disposed on the gate structure; and
- a second spacer layer disposed on the gate structure, wherein the first spacer layer comprises an oxide and the second spacer layer comprises a nitride.

14. The semiconductor structure as claimed in claim 13, wherein the first liner comprises an oxide.

15. A method of forming a semiconductor structure, comprising:
- forming a first work function layer on a substrate;
- forming a second work function layer on the first work function layer;
- forming a protective layer on the second work function layer;
- forming a gate stack on the protective layer;
- forming a first liner on a top surface and side surfaces of the gate stack;
- forming a second liner on a top surface and side surfaces of the first liner;
- forming a planarization layer on the second liner;
- performing an etching process, to remove the second work function layer and expose the first work function layer; and
- forming a gate plug on the planarization layer and a wire on the protective layer, so that the gate plug is in contact with the first work function layer and the second work function layer, and the wire is in electrical contact with the gate plug and extends through both the first liner and the second liner.

16. The method as claimed in claim 15, wherein the etching process is performed after the formation of the planarization layer.

17. The method as claimed in claim 15, wherein performing the etching process further comprises:
- performing a first etching process by using the second liner as an etch stop layer to remove the planarization layer;
- performing a second etching process by using the first liner as an etch stop layer to remove the second liner and the protective layer; and
- performing a third etching process by using the first liner as an etch stop layer to remove the second work function layer.

18. The method as claimed in claim 17, wherein the third etching process is performed to remove the second work function layer and the first work function layer.

19. The method as claimed in claim 15, wherein the formation of the first liner further comprises:

forming the first liner on the gate stack; and removing a portion of the first liner to expose an exposed portion of the gate stack, wherein the second liner covers the exposed portion of the gate stack.

* * * * *